United States Patent [19]

Howard

[11] Patent Number: 4,778,582
[45] Date of Patent: Oct. 18, 1988

[54] PROCESS FOR MAKING A THIN FILM METAL ALLOY MAGNETIC RECORDING DISK WITH A HYDROGENATED CARBON OVERCOAT

[75] Inventor: James K. Howard, Morgan Hill, Calif.

[73] Assignee: International Business Machines Corporation, Armonk, N.Y.

[21] Appl. No.: 57,076

[22] Filed: Jun. 2, 1987

[51] Int. Cl.$^4$ .............................................. C23C 15/34
[52] U.S. Cl. ............................. 204/192.15; 204/192.2
[58] Field of Search ...................... 204/192.15, 192.16, 204/192.2; 428/611, 667

[56] References Cited

U.S. PATENT DOCUMENTS

| | | | |
|---|---|---|---|
| 4,411,963 | 10/1983 | Cline | 204/192.2 X |
| 4,503,125 | 3/1985 | Nelson et al. | 428/408 |
| 4,552,820 | 11/1985 | Ballard et al. | 428/611 |
| 4,587,179 | 5/1986 | Nakamura et al. | 204/192.2 X |
| 4,610,911 | 9/1986 | Natarajan et al. | 428/213 |
| 4,654,276 | 3/1987 | Ahlert et al. | 204/192.2 X |

FOREIGN PATENT DOCUMENTS

| | | | |
|---|---|---|---|
| 155668 | 8/1985 | Japan | 14/12 |
| 157725 | 8/1985 | Japan | 5/72 |
| 0156069 | 10/1985 | Japan | 14/6 |
| 014102 | 1/1986 | Japan | 6/00 |
| 117727 | 6/1986 | Japan | 5/66 |

OTHER PUBLICATIONS

L. M. Briggs, et al., "Properties of Hydrogenated Carbon Films Produced by Reactive Magnetron Sputtering", Solar Energy Materials (Jul. 1981), pp. 97–106.

L. C. Botten, et al., "Hydrogenated Carbon Films Produced by Sputtering in Argon-Hydrogen Mixtures", Applied Optics, vol. 21, No. 20 (Oct. 1982), pp. 3615–3617.

A. Hayashi, et al., "Tetrahedral Carbon Film by Hydrogen Gas Reactive RE-Sputtering of Graphite Onto Low Temperature Substrate", Solid State Communications, vol. 50, No. 8 (1984), pp. 713–716.

"A Wear-Resistant Coating", Research Disclosure, Sept. 1986, No. 269.

D. Nir, "Energy Dependence of the Stress in Diamond-like Carbon Films", The Journal of Vacuum Science and Technology, vol. 4, No. 6 (Nov.-Dec. 1986), pp. 2954–2955.

Primary Examiner—John F. Niebling
Assistant Examiner—Nam X. Nguyen
Attorney, Agent, or Firm—Thomas R. Berthold

[57] ABSTRACT

A thin film metal alloy magnetic recording disk is manufactured by sputter deposition in an atmosphere consisting essentially of argon and hydrogen. A thin cobalt-based alloy magnetic film and a hydrogenated carbon overcoat are both formed in the same sputtering atmosphere by successive activation of a cobalt-based alloy target and a carbon target. The hydrogen present in the sputtering atmosphere has no adverse effect on the magnetic properties of the disk.

4 Claims, 2 Drawing Sheets

PROCESS FOR MAKING A THIN FILM METAL ALLOY MAGNETIC RECORDING DISK WITH A HYDROGENATED CARBON OVERCOAT

TECHNICAL FIELD

This invention relates to a process for the manufacture of a magnetic recording disk and in particular to a process for the manufacture of a disk having a thin film metal alloy magnetic layer and a protective overcoat of a hydrogen-carbon film.

BACKGROUND OF THE INVENTION

Thin film metal alloy magnetic recording disks typically comprise a substrate, such as an aluminum-magnesium (AlMg) alloy with a nickel-phosphorous (NiP) surface coating, a cobalt-based alloy sputter deposited as the magnetic layer on the substrate, and a protective overcoat, such as a sputter-deposited amorphous carbon film, formed on the magnetic layer. Such disks may also include a sputter-deposited underlayer, such as a layer of chromium (Cr), chromium-vanadium (CrV) or tungsten (W), between the substrate and the magnetic layer, and a sputter-deposited adhesion layer, such as a Cr, W or titanium (Ti) layer, between the magnetic layer and the protective overcoat. A general description of the structure of such thin film disks is given in U.S. Pat. Nos. 4,610,911 to Opfer et al., and 4,552,820 to Lin et al.

One of the problems with such disks is the suitability of the protective overcoat to provide corrosion resistance for the underlying magnetic layer and resistance to wear caused by contact of the disk by the air-bearing slider which carries the magnetic recording head. Protective overcoats of amorphous carbon formed by the sputtering of a graphite target in the presence of pure argon (Ar), such as described in U.S. Pat. No. 4,503,125 to Nelson et al., have not been proven to provide the magnetic layer with satisfactory corrosion resistance.

Amorphous hydrogenated carbon films formed by chemical vapor deposition (CVD) plasma decomposition of hydrocarbon gases or reactive sputtering of a graphite target in an atmosphere of argon and hydrocarbon gases have been suggested as suitable for use as thin film disk protective overcoats. Japanese Kokai No. 60-155668 describes a protective overcoat formed by sputtering carbon in an atmosphere of various hydrocarbon gases, and Japanese Kokai No. 60-157725 describes a protective overcoat formed by sputtering a carbon target in the presence of various hydrocarbon gases or a mixture of such hydrocarbon gases with Ar, helium (He) or hyrogen ($H_2$).

SUMMARY OF THE INVENTION

The invention is a process for manufacturing a thin film disk by sputter depositing both the magnetic layer and protective overcoat in an atmosphere consisting essentially of Ar and $H_2$. The process may also include the steps of forming an underlayer for the magnetic layer and an adhesion layer for the protective overcoat in the same Ar-$H_2$ atmosphere. Because the entire disk structure can be formed by sputter deposition in the same atmosphere, the process permits continuous in-line fabrication of the disks. The process results in a disk with excellent magnetic properties and with a hydrogenated carbon (C:H) protective overcoat formed by the reaction of the $H_2$ gas with the carbon from the sputtering target. The resulting overcoat has corrosion resistance and wear resistance exceeding that of conventional amorphous carbon overcoats.

For a fuller understanding of the nature and advantages of the present invention reference should be made to the following detailed description taken in conjunction with the accompanying drawings.

DESCRIPTION OF THE PREFERRED EMBODIMENTS

Figure 1:
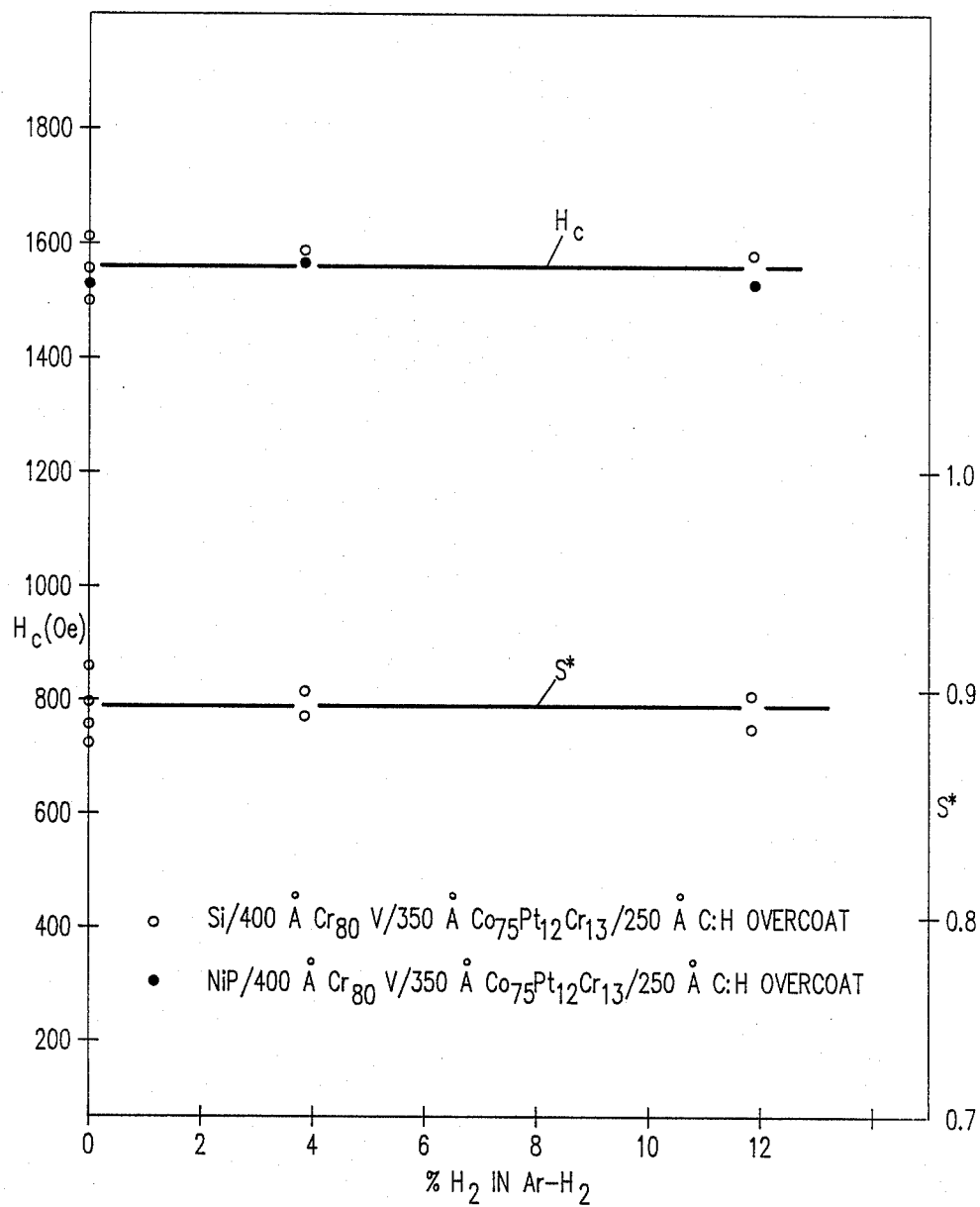
FIG. 1 is a plot of coercivity (Hc) and coercivity squareness (S*) as a function of %$H_2$ in the Ar-$H_2$ atmosphere during the fabrication of the complete disk structure, including the magnetic layer and the hydrogenated carbon overcoat.

In order to study the feasibility of fabricating a thin film disk with a hydrogenated carbon overcoat formed by the known technique of reactive sputter deposition in a hydrocarbon atmosphere, the film structures of various disks were formed by sputter deposition in argon-methane (Ar-$CH_4$) atmospheres with varying amounts of $CH_4$. The magnetic properties of such disks were then examined. The disks were formed in a single pump down of a RF powered S-Gun (registered trademark of Varian Associates) magnetron sputtering chamber containing a silicon (Si) substrate and targets of $Cr_{80}V$ and cobalt-platinum-chromium ($Co_{77}PtCr$). Ar and $CH_4$ were introduced into the chamber and maintained at a pressure of approximately 3-4 m Torr. The $Cr_{80}V$ target was activated at 320 watts with a $-50$ V. bias on the substrate, resulting in a 300 Angstrom thick underlayer formed on the Si substrate at a rate of approximately 33 Angstroms/minute. Thereafter, the $Co_{77}PtCr$ target was activated at 270 watts with the substrate maintained at ground potential, resulting in a 300 Angstrom thick $Co_{77}PtCr$ magnetic layer formed on the $Cr_{80}V$ underlayer.

As shown in Table 1, the presence of $CH_4$ in the atmosphere during the sputter deposition of the cobalt-based alloy magnetic layer substantially reduced the coercivity ($H_c$) and rendered the disks unacceptable as a magnetic recording medium.

TABLE 1

| %$CH_4$ in Ar—$CH_4$ | 0 | 20 | 50 |
|---|---|---|---|
| $H_c$ (Oersteds) | 1620 | 210 | 190 |

Disk Structure: Si/300 Å $Cr_{80}$ V/300 Å $Co_{77}PtCr$

Thus, the results of Table 1 indicate that, regardless of the suitability of an overcoat formed by reactive sputtering of a carbon target in an Ar-$CH_4$ atmosphere, such an overcoat would have to be formed as a separate step in the fabrication process, either by removing the disks from one sputtering chamber with an Ar atmosphere and placing them in a second chamber with an Ar-$CH_4$ atmosphere, or by introducing $CH_4$ into the sputtering chamber after the Co-based magnetic layer has been completely formed. Neither procedure is compatible with a continuous in-line disk fabrication process, wherein the disk substrates continuously enter and exit a single sputtering station.

Disks having a film structure similar to those whose test results are listed in Table 1 were fabricated under similar sputtering conditions, with the exception that the atmosphere was Ar-$H_2$, with varying amounts of $H_2$. In addition, a hydrogenated carbon overcoat of 250 Angstrom thickness was also formed on the CoPtCr magnetic layer of such disks following the deposition of the magnetic layer. In the fabrication of such disks, a $Cr_{80}V$ underlayer was first formed on the substrate in the S-Gun chamber with the Ar-$H_2$ atmosphere maintained at 3-4 m Torr., RF power to the $Cr_{80}V$ target of 235 watts, and a $-50$ V. bias on the substrate. This resulted in a 400 Angstrom thick underlayer deposited at a rate of approximately 32 Angstroms/minute. A $Co_{75}PtCr$ magnetic film was then formed in the same atmosphere by activating the $Co_{75}PtCr$ target at 240 watts, with the substrate maintained at ground potential. A 350 Angstrom thick $Co_{75}PtCr$ magnetic film was formed at a deposition rate of approximately 37 Angstroms/minute. A 200 Angstrom thick hydrogenated carbon overcoat was then formed on the magnetic film at a rate of approximately 6-7 Angstroms/minute by activating a graphite target at 250 watts while maintaining the substrate at ground potential. These disk structures were formed on both Si and AlMg-NiP substrates.

The $H_c$ and coercivity squareness (S*) of such disks were measured and are shown as a function of percentage $H_2$ in FIG. 1. As is apparent from FIG. 1, the sputter deposition of the $Cr_{80}V$ underlayers and $Co_{75}PtCr$ magnetic layers in the reactive Ar-$H_2$ environment unexpectedly had no effect on the magnetic properties of the disks. The complete lack of any degradation in magnetic properties was also observed when the composition of the magnetic layer was changed to $Co_{68}PtCr$.

The results shown in FIG. 1 clearly indicate that it is possible to fabricate thin film metal alloy disks with a hydrogenated carbon overcoat by a continuous in-line process wherein all layers in the disk structure are sputter deposited in an atmosphere consisting essentially of Ar and $H_2$.

Figure 2:
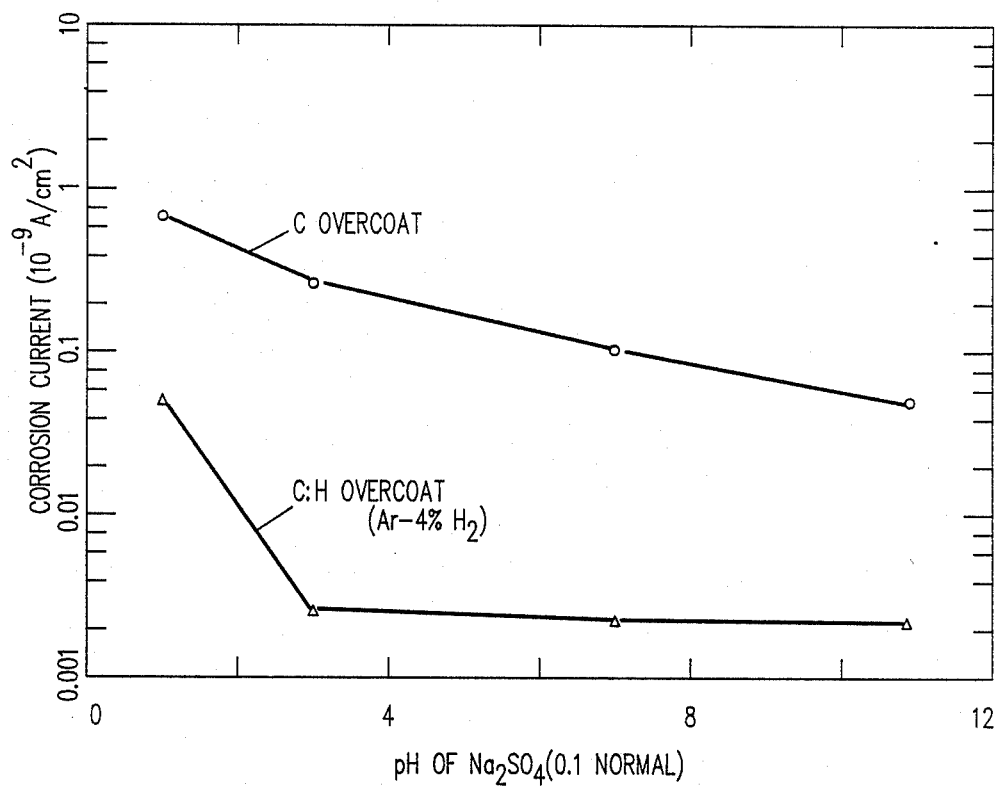
FIG. 2 is a comparison of corrosion current as a function of pH for a conventional amorphous carbon overcoat and for a hydrogenated carbon overcoat formed by the process of the present invention.

The corrosion resistance of the hydrogenated carbon overcoat formed by sputtering in Ar-$H_2$ is substantially improved over the conventional amorphous carbon formed by sputtering in pure Ar. FIG. 2 illustrates the measured corrosion current in an electrolyte (0.1 normal $Na_2SO_4$) for disks with a CoPtCr magnetic layer at various pH levels of the electrolyte for the two types of overcoats.

The hydrogenated carbon overcoat formed in the Ar-$H_2$ sputtering atmosphere at relatively low (8%) $H_2$ concentration also exhibits corrosion resistance comparable to that of hydrogenated carbon overcoats formed in Ar-$CH_4$ sputtering atmospheres with relatively high (50%) $CH_4$ concentrations, as determined by measured corrosion currents.

The preferred minimum amount of $H_2$ necessary during the process is believed to be approximately 1%. At $H_2$ amounts less than approximately 1% in the Ar-$H_2$ atmosphere, there was no significant improvement in corrosion resistance in such overcoats over conventional amorphous carbon overcoats.

A CoPtCr disk made according to the process of this invention (4% $H_2$) with a 100 Angstrom thick Ti adhesion layer, a 200 Angstrom thick C:H overcoat and a conventional perfluoroalkyl polyether type lubricant applied to the C:H overcoat exhibited excellent wear resistance and reduction in static friction when tested for over 10,000 start-stop cycles of a disk file, during which the slider contacts the same track region of the disk. No wear tracks were observed and the static friction between the slider and the disk substantially decreased as the number of start-stop cycles increased.

The structures of hydrogenated carbon films formed according to the above described process were analyzed by Raman spectrometry. The peak intensity occurred at 1500-1550 wavenumbers ($cm^{-1}$). The peak intensity for a film formed in Ar-$H_2$ (12% $H_2$) is significantly less than for a film formed in Ar-$H_2$ (8% $H_2$). The lower peak intensity indicates more $sp^3$ bonding in the film, since the Raman efficiency for $sp^3$ bonds is less than for $sp^2$ bonds.

In a preferred embodiment for use of the above described process in the fabrication of thin film metal alloy magnetic recording disks, all of the films in the completed disk structure are sputter deposited in a production type in-line sputtering system having a single sputtering station. For example, if the disk structure is to include an underlayer beneath the magnetic layer and an adhesion layer between the hydrogenated carbon overcoat, then there would be four target areas within the single station. Ar and $H_2$ are introduced into the sputtering chamber. All of the target areas are exposed to the same Ar-$H_2$ atmosphere which is maintained at the same pressure during the entire process. The disk substrates enter the station on a continuous transport system and pass the target room in succession. If an underlayer is to be used, then the substrates pass in front of that specific sputtering target for a predetermined time sufficient to form the desired underlayer thickness on the substrate. The disks then pass the targets for the magnetic layer and the adhesion layer. Finally the disks pass the graphite target to form the hydrogenated carbon overcoat. In this manner the entire disk structure is fabricated in a continuous in-line process which has $H_2$ present in the sputtering atmosphere. The $H_2$, which is necessary to form the hydrogenated carbon overcoat, has no adverse effect on the formation of any of the other films in the disk structure and no adverse effect on the magnetic properties of the completed disk.

The disk structures formed by the process of this invention included a CrV underlayer and a CoPtCr magnetic layer. However, the process is fully applicable to disk structures without an underlayer and with other Co-based magnetic layer compositions.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A method of fabricating a thin film magnetic recording disk comprising the steps of:
   sputter depositing on a disk substrate, in an atmosphere consisting essentially of argon and hydrogen and from either a cobalt-based alloy target or a set of targets including a cobalt-containing target, a cobalt-based alloy magnetic film consisting essentially of only the material present in either the cobalt-based alloy target or said set of targets; and
   sputter depositing over the magnetic layer, in substantially the same atmosphere and from a carbon-containing target, a protective overcoat containing carbon from the carbon target and hydrogen from the argon-hydrogen atmosphere.

2. The method according to claim 1 further comprising the step of, prior to sputter depositing the magnetic film, sputter depositing an underlayer on the substrate in an atmosphere consisting essentially of argon and hydrogen.

3. The method according to claim 1 further comprising the step of, prior to sputter depositing the overcoat, sputter depositing an adhesion layer on the magnetic film in substantially the same atmosphere.

4. A sputter deposition method of fabricating a thin film magnetic recording disk comprising the steps of:
providing sputtering targets of a cobalt-based alloy and carbon in a single sputtering station;
exposing the targets to the same atmosphere consisting essentially of Ar and $H_2$, the $H_2$ being present in an amount greater than approximately 1% of the Ar-$H_2$;
passing a disk substrate past the cobalt-based alloy target to form a magnetic layer consisting essentially of only the material present in the cobalt-based alloy target; and
passing the disk substrate past the carbon target to form an overcoat consisting essentially of only the carbon from the carbon target and the hydrogen from the Ar-$H_2$ atmosphere.

* * * * *